(12) United States Patent
Musashi (10) Patent No.: US 10,153,392 B2
(45) Date of Patent: Dec. 11, 2018

(54) METHOD OF MANUFACTURING LIGHT EMITTING ELEMENT

(71) Applicant: NICHIA CORPORATION, Anan-shi, Tokushima (JP)

(72) Inventor: Naoki Musashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/703,480

(22) Filed: Sep. 13, 2017

(65) Prior Publication Data

US 2018/0083159 A1 Mar. 22, 2018

(30) Foreign Application Priority Data

Sep. 21, 2016 (JP) ................................. 2016-184370

(51) Int. Cl.
| | |
|---|---|
| *H01L 33/00* | (2010.01) |
| *B32B 43/00* | (2006.01) |
| *B23K 26/08* | (2014.01) |
| *B23K 26/53* | (2014.01) |
| *B23K 101/40* | (2006.01) |
| *H01L 33/32* | (2010.01) |

(Continued)

(52) U.S. Cl.
CPC .......... *H01L 33/0079* (2013.01); *B23K 26/53* (2015.10); *B32B 43/006* (2013.01); *B23K 26/0823* (2013.01); *B23K 26/0853* (2013.01); *B23K 26/0876* (2013.01); *B23K 2101/40* (2018.08); *B32B 2310/0843* (2013.01); *B32B 2457/14* (2013.01); *H01L 33/32* (2013.01); *H01L 33/405* (2013.01); *H01L 33/44* (2013.01)

(58) Field of Classification Search
CPC .............. B32B 43/006; C09J 2205/302; Y10T 156/1158; Y10T 156/1917; Y10S 156/93; Y10S 156/941; B23K 26/0823; B23K 26/0853; B23K 26/0876; B23K 26/53
See application file for complete search history.

(56) References Cited

U.S. PATENT DOCUMENTS 8,395,082 B2 * 3/2013 Zhang ................ B23K 26/0648
219/121.67
8,679,280 B2 * 3/2014 Dang ................ B23K 26/0063
156/247

(Continued)

FOREIGN PATENT DOCUMENTS

| JP | 2004-087775 A | 3/2004 |
|---|---|---|
| JP | 2007-158133 A | 6/2007 |

(Continued)

*Primary Examiner* — Mark A Osele (57) ABSTRACT

A method of manufacturing a light emitting element includes: providing a wafer including a substrate and a semiconductor layered body formed at an upper surface of the substrate; irradiating the wafer with laser light by performing first and second patterns of scanning; and separating the substrate from the semiconductor layered body. In the first pattern of scanning, the wafer is irradiated with the laser light outwardly from an inner side of the wafer or inwardly from an outer side of the wafer, so that a region irradiated with the laser light enlarges. In the second pattern of scanning, the wafer is irradiated with the laser light so that the laser light intersects with a circumferential edge of the wafer at a plurality of portions.

15 Claims, 4 Drawing Sheets

(51) Int. Cl.
*H01L 33/40* (2010.01)
*H01L 33/44* (2010.01)

(56) References Cited

U.S. PATENT DOCUMENTS

| | | | |
|---|---|---|---|
| 8,986,497 B2* | 3/2015 | Sercel | B32B 38/0008 156/712 |
| 9,531,154 B2* | 12/2016 | Koyanagi | H01L 33/0079 |
| 2005/0227455 A1* | 10/2005 | Park | B23K 26/0732 438/458 |
| 2007/0141806 A1 | 6/2007 | Uemura et al. | |
| 2011/0312115 A1* | 12/2011 | Kato | B23K 26/0823 438/33 |
| 2012/0049238 A1 | 3/2012 | Tanaka et al. | |
| 2013/0161794 A1* | 6/2013 | Aida | C30B 33/04 257/615 |
| 2014/0030837 A1 | 1/2014 | Im et al. | |

FOREIGN PATENT DOCUMENTS

| | | |
|---|---|---|
| JP | 2011-195377 A | 10/2011 |
| JP | 2012-069934 A | 4/2012 |

* cited by examiner

METHOD OF MANUFACTURING LIGHT EMITTING ELEMENT

CROSS-REFERENCE TO RELATED PATENT APPLICATION

The present application claims priority under 35 U. S. C. § 119 to Japanese Patent Application No. 2016-184370, filed Sep. 21, 2016. The contents of Japanese Patent Application No. 2016-184370 are incorporated herein by reference in their entirety.

BACKGROUND

1. Technical Field

The present disclosure relates to a method of manufacturing a light emitting element.

2. Description of Related Art

There is a known method including: layering a multitude of semiconductor layers on a substrate made of sapphire or the like for epitaxial growth; and separating the substrate from the semiconductor layered body (for example, see JP 2007-158133 A, JP 2011-195377 A and others).

The semiconductor layered body is very thin relative to the substrate. In order to swiftly separate such a thin semiconductor layered body from the substrate while avoiding any damage, troublesome and highly precise operations become necessary. Hence, with the current state of the art, the separating a semiconductor layered body takes time thereby reducing semiconductor element manufacturing yield.

SUMMARY

The present disclosure has been made in light of the above-described problem, and an object thereof is to provide a method of manufacturing a light emitting element which achieves a reduction in time taken to separate a substrate and a semiconductor layered body from each other thereby improving yield.

A method of manufacturing a light emitting element of the present disclosure includes: providing a wafer including a substrate and a semiconductor layered body formed at an upper surface of the substrate; irradiating the wafer with laser light by performing first and second patterns of scanning; and separating the substrate from the semiconductor layered body. In the first pattern of scanning, the wafer is irradiated with the laser light outwardly from an inner side of the wafer or inwardly from an outer side of the wafer, so that a region irradiated with the laser light enlarges. In the second pattern of scanning, the wafer is irradiated with the laser light so that the laser light intersects with a circumferential edge of the wafer at a plurality of portions.

The present disclosure provides a method of manufacturing a light emitting element which reduces the time taken to separate the substrate and the semiconductor layered body from each other thereby improving yield.

DETAILED DESCRIPTION OF EMBODIMENTS

With reference to the drawings, a description will be given of a method of manufacturing a light emitting element of the present disclosure. Note that, the size, positional relationship and the like of members shown in the drawings may be exaggerated for the sake of clarity. Further, in the following description, identical or similar members are referred to by identical names and denoted by identical reference signs in principle, and a detailed description thereof will be omitted as appropriate. Further, terms such as "an upper surface", "a lower surface" and the like mean relative positional relationship.

A method of manufacturing a light emitting element of the present disclosure includes: providing a wafer that includes a substrate and a semiconductor layered body formed at an upper surface of the substrate; irradiating the wafer with laser light; and separating the substrate from the semiconductor layered body. The irradiating the wafer with laser light in the method of manufacturing a light emitting element includes: scanning the wafer with the laser light outward from an inner side of the wafer or inward from an outer side of the wafer, so that a region irradiated with the laser light enlarges (hereinafter, also referred to as the "scanning pattern A" corresponding to a first pattern of scanning); and scanning the wafer with the laser light so that the laser light intersects with a circumferential edge of the wafer at a plurality of portions (hereinafter, also referred to as the "scanning pattern B" corresponding to a second pattern of scanning).

According to the method, the scanning pattern A improves the separating property on the side inner than the circumferential edge of the wafer, and the scanning pattern B improves the separating property at and around the circumferential edge of the wafer. Thus, the method improves the separating property over the entire wafer. Hence, the method improves the semiconductor element manufacturing yield.

Providing Wafer

Firstly, a wafer that includes a substrate and a semiconductor layered body formed at the upper surface of the substrate is provided. The substrate is just required to be capable of epitaxially growing a semiconductor layer, and for example, it may be an insulating substrate such as sapphire ($Al_2O_3$), spinel ($MgAl_2O_4$) or the like, or a semiconductor substrate such as silicon carbide (SiC), gallium nitride (GaN) or the like.

The semiconductor layered body 2 representatively includes, in sequence from the upper surface of the substrate 1, a first conductivity type semiconductor layer, an active layer, and a second conductivity type semiconductor layer. For example, a nitride semiconductor such as $In_XAl_YGa_{1-X-Y}N$ (0≤X, 0≤Y, X+Y≤1) is suitably employed as the layers included in the semiconductor layered body 2.

Forming Second Electrode

Preferably, a second electrode 3 is formed at the semiconductor layered body 2. The second electrode 3 can be formed by, for example: forming a mask, which has an opening corresponding to the region where the second electrode 3 is to be formed, using resist at the upper surface of the second conductivity type semiconductor layer; layering a metal material by sputtering or the like; and thereafter removing the mask. The second electrode 3 is preferably made of a metal material being highly reflective to light from the light emitting layer. For example, use of Ag, Al or the like is preferable.

Forming Second Protective Film

A second protective film 4 may be formed at the semiconductor layered body 2. The second protective film 4 can be formed by: forming a mask, which has an opening corresponding to the region where the second protective film 4 is to be formed, at the upper surface of the second conductivity type semiconductor layer using resist; layering an insulating material by sputtering or the like; and thereafter removing the mask. The second protective film 4 is preferably made of, for example, $SiO_2$, SiN, SiON or the like.

Forming Bonding Layer

Preferably, a bonding layer 5 is formed on the upper surface side of the semiconductor layered body and on the second electrode 3 and the second protective film 4. The bonding layer 5 can be formed by layering an electrically conductive material by sputtering or the like. The bonding layer 5 may be made of a metal material such as Ti, W, Pt, Au, Sn, Au, Ag, Cu, Bi, Pb, or Zn, and alloy of the foregoing metals. The alloy made of such metal materials may be AuSn, NiSn, PbSn, TiW or the like. Among others, it is preferable to employ a multilayer film in which the materials are layered in sequence of Ti/NiSn or Ti/AuSn from the upper surface side of the semiconductor layered body 2. The thickness of the bonding layer 5 may be adjusted as appropriate depending on the employed materials and the like, and may be in a range of 3 μm to 4 μm, for example. When the wafer is bonded to a supporting substrate 7 which will be described later, a warp may be invited. Accordingly, preferably the material, thickness, layered structure and the like of the bonding layer 5 is selected so that the warp can be corrected as appropriate. Thus, the wafer can be irradiated with laser evenly within its surface.

Bonding Supporting Substrate

The supporting substrate 7 to be bonded to the semiconductor layered body 2 side of the wafer is provided. The supporting substrate 7 may be, for example, Si, SiC, AlN, AlSiC, Cu—W, Cu—Mo, Cu-diamond or the like. Among others, the substrate is preferably made of Si which is inexpensive and facilitates singulation. On the supporting substrate 7, preferably a bonding layer 6 is provided for bonding to the semiconductor layered body 2 side of the wafer. The material of the bonding layer 6 can be selected from materials similar to those of the bonding layer formed on the semiconductor layered body 2 as described above. Note that, the bonding layer is just required to be formed on one of the semiconductor layered body 2 and the supporting substrate 7.

When the bonding layers 5, 6 are respectively formed on the semiconductor layered body 2 and the supporting substrate 7, the bonding of the wafer and the supporting substrate 7 can be performed by bringing the respective bonding layers 5, 6 into contact with each other and applying heat. The applying heat can be performed by any known means such as placing the wafer or supporting substrate 7 side on a hot plate or the like. This melts the bonding layers 5, 6 and bonds the bonding layers 5, 6 to each other.

The semiconductor layered body 2 formed on the substrate 1 is very thin and, therefore, difficult to be handled after the substrate 1 is separated. Here, by bonding the upper surface of the wafer and the supporting substrate 7 to each other and thereafter separating the substrate 1 from the semiconductor layered body 2, the semiconductor layered body 2 after the separation can be handled easier.

Irradiation of Laser Light

The wafer is irradiated with laser light. Here, the irradiating with laser light includes: scanning the wafer with the laser light outward from the inner side of the wafer or inwardly from the outer side of the wafer, so that the region irradiated with the laser light enlarges (scanning pattern A); and scanning the wafer with the laser light so that the laser light intersects with the circumferential edge of the wafer at a plurality of portions (scanning pattern B). The order of performing the scanning pattern A and the scanning pattern B is not particularly specified. Further, while the laser light may be emitted from above or below the wafer, that is, the wafer may be irradiated with the laser light on the substrate 1 side or on the semiconductor layered body 2 side, preferably the wafer is irradiated with the laser light from the substrate 1 side. By the wafer being irradiated with the laser light from the substrate 1 side, the risk of any damage to the semiconductor layered body 2 due to the laser light can be reduced.

The laser light may preferably be, for example, YAG laser, KrF excimer laser, semiconductor laser, $CO_2$ laser, titanium-sapphire laser or the like. The output may be in a range of 0.5 W to 5 W, and preferably in a range of 1.0 W to 1.5 W. When the laser light is emitted in a pulsed manner, the emission pitch may be in a range of 0.01 μm to 100 μm, preferably in a range of 0.1 μm to 50 μm, and more preferably in a range of 1.0 μm to 30 μm. The wafer is preferably irradiated with the laser light having the focus position of the laser light set at the interface between the substrate 1 and the semiconductor layered body 2. When the wafer is warped, the interface between the substrate 1 and the semiconductor layered body 2 may vary in the depth direction. Accordingly, the focus position is preferably set in accordance with the interface that varies along the warp of the wafer. While the focus position in the depth direction may not necessarily be identical between the scanning pattern A and the scanning pattern B, preferably the focus position is identical between them. As used herein, being identical permits a deviation of about ±100 μm in the thickness direction. Further, the focus position may be varied during emission of the laser light.

In the scanning pattern A, the wafer is scanned with the laser light from the central region of the wafer toward the circumferential portion thereof, or from the circumferential portion of the wafer toward the central region thereof, so that the region irradiated with the laser light enlarges. It is particularly preferable that the wafer is scanned with the laser light spirally or concentrically about the center of the wafer, over the entire wafer along its circumferential edge excluding the orientation flat portion, and that the wafer is spirally scanned with the laser light (see FIG. 1). This is advantageous in that the wafer can be scanned by single-time scanning with the laser emission being turned ON. The laser light scanning in this manner allows the entire wafer to be uniformly irradiated. While it depends on the size of the wafer, for example, the wafer of four inches is preferably scanned with the laser light so that the scanning track passes over a line, which is parallel to the orientation flat and passes through the center of the wafer, for 200 to 30,000 times, preferably for 2,000 to 10,000 times.

Figure 2:
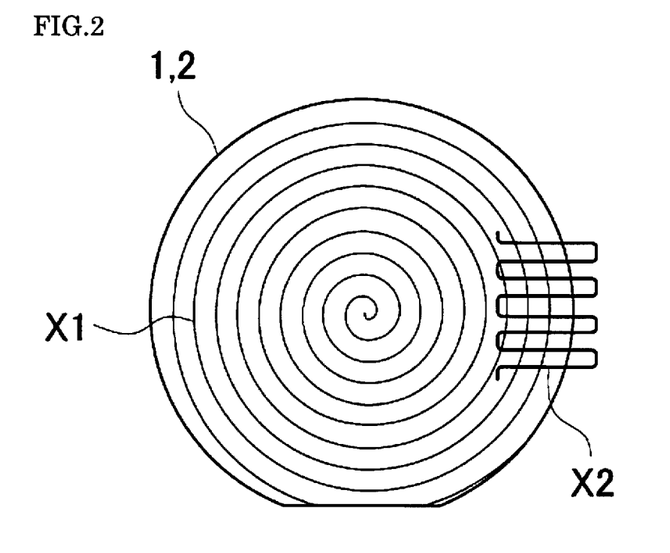
FIG. 2 is a plan view of a wafer being scanned with laser light intersecting with the circumferential edge of the wafer at a plurality of portions in the method of manufacturing a light emitting element of the present disclosure.

In the scanning pattern B, the wafer is scanned with the laser light so that the scanning track passes over the circumferential edge of the wafer for a plurality of times. This ensures separation between the substrate 1 and the semiconductor layered body 2 at the circumferential edge of the wafer. While the laser light may intersect with the edge of the wafer at the orientation flat portion, the laser light preferably intersects with the circumferential edge of the wafer at a plurality of portions excluding the orientation flat portion (see FIGS. 2 and 4). As to the angle formed by the circumferential edge of the wafer and the scanning track of the laser light intersecting with each other, for example, the angle of the scanning track relative to the tangent at the intersection between the scanning track of the laser light and the circumferential edge of the wafer falls within a range of 45° to 135°. Further, the condition of the plurality of times is satisfied by twice or more, and this count is preferably adjusted as appropriate according to the condition of the scanning pattern A described above. In the scanning pattern B, the perimeter length within the region scanned with the laser light is preferably equal to or less than ⅓, more preferably equal to or less than ¼, and further preferably equal to or less than ⅕, of the entire perimeter length of the circumferential edge of the wafer (see FIG. 2). In the scanning pattern B, the scanning angle of the laser light relative to the tangent at the circumferential edge of the wafer may be different among the plurality of intersecting portions. For example, the wafer may be scanned with the laser light so that straight scanning tracks that each pass one intersection point at an identical predetermined angle relative to the orientation flat become parallel to each other, and so that the intersecting angle between the circumferential edge of the wafer and the scanning track of the laser light is gradually varied (see FIGS. 2 and 4). As used herein, the predetermined angle may be, for example, a range from 90° to 0°, and particularly an angle of 90° or 0°. Further, for example, by radially scanning the wafer from the central region of the wafer, the scanning angle of the laser light may be set to be identical at every tangent at the circumferential edge of the wafer. Note that, so long as the scanning track intersects with the circumferential edge of the wafer at a plurality of portions, the scanning may be performed just once or for a plurality of times. For example, as shown in FIG. 2, the scanning may be performed in a reciprocating manner for a plurality of times so that the laser light intersects with the circumferential edge of the wafer in a predetermined region. Alternatively, the scanning may be performed for a plurality of times so that the laser light every time intersects with the circumferential edge of the wafer at least once.

The scanning pattern A tends to improve the separating property at the interface between the substrate 1 and the semiconductor layered body 2 as compared to the scanning pattern B. This may be attributed to the warp not unusually occurring at the wafer being irradiated with the laser light. For example, the bonded body made up of the wafer and the supporting substrate 7 has a warp, that is, the center of the bonded body becomes convex toward the supporting substrate 7 side, forming a curved surface from the center toward the circumferential edge. With such a wafer, for example by being spirally scanned with the laser light from the center of the wafer toward the circumferential edge, separation progresses from the center of the wafer toward the circumferential edge. At the same time, the recovering force from the warped shape of the substrate 1 to the flat shape acts. These phenomena may facilitate separation of the substrate 1 from the semiconductor layered body 2.

On the other hand, while performing just the scanning pattern A improves the separating property between the substrate 1 and the semiconductor layered body 2 at the region excluding the circumferential portion of the wafer, separation tends to lag at the circumferential portion of the wafer. That is, by the scanning pattern A, while separation can be visually recognized at the inner region of the wafer, separation cannot be recognized at the circumferential edge of the wafer. Accordingly, by further performing the scanning pattern B in which the laser light intersects with the circumferential edge of the wafer at a plurality of portions, the separating region can also be formed at the circumferential portion of the wafer. Thus, separation between the substrate 1 and the semiconductor layered body 2 is facilitated over the entire wafer, shortening the time taken to achieve separation. Note that, for example, if the scanning pattern A can be performed so as to perfectly follow the circumferential edge of the wafer, the scanning pattern B can be dispensed with. However, it is practically extremely difficult to scan the wafer with laser light following the circumferential edge of the wafer. Therefore, in the present embodiment, the scanning pattern B is performed additionally to the scanning pattern A.

Separating Semiconductor Layered Body

After the wafer is irradiated with laser light, the substrate 1 is separated from the semiconductor layered body 2. As used herein, the separation may refer to separation that naturally occurs upon the irradiation with the laser light because of pressure of gas generated at the interface between the substrate 1 and the semiconductor layered body 2, or stress attributed to the difference in thermal expansion coefficient between the material of the substrate 1 and the material of the semiconductor layered body 2, or the separation may include other operation. Other operation may be, for example, immersing the wafer in water or warm water, injecting liquid or gas to the end surface of the portion of the wafer having undergone the scanning performed so as to intersect with the circumferential edge of the wafer, directly or indirectly heating the wafer, applying ultrasonic waves to the wafer or the like. In combination with such an operation, for example, the portion of the wafer circumferential edge where the laser light intersected with in scanning is allowed to effectively function as the origin of the start of separation from the wafer circumferential edge. This realizes separation between the semiconductor layered body 2 and the substrate 1 by a shorter time and at higher precision. When the region to be the origin of the start of separation formed at the circumferential edge of the wafer is formed at the entire circumferential edge of the wafer, separation from that origin region between the substrate 1 and the semiconductor layered body 2 is further facilitated. On the other hand, the separation can be facilitated also when the origin region is formed at part of the circumferential edge of the wafer. This may be explained as follows. For example, in the case where the wafer is immersed in water or warm water in separating the substrate 1 and the semiconductor layered body 2 from each other, the wafer can be impregnated with water or warm water from the origin of the start of separation formed at part of the circumferential edge of the wafer, whereby separation at the circumferential edge of the wafer progresses from the part of the circumferential edge toward the entire circumferential edge.

After the substrate 1 is separated from the semiconductor layered body 2, the side of the semiconductor layered body 2 where the substrate 1 has been disposed may be polished by CMP (Chemical Mechanical Polishing).

Forming First Electrode

Thereafter, preferably a first electrode 8 is formed at the lower surface of the first conductivity type semiconductor layer. The first electrode 8 is formed by: forming a mask, which has an opening corresponding to the region where the first electrode 8 is to be formed, on the first conductivity type semiconductor layer of the semiconductor layered body 2 using resist; layering a metal material by sputtering or the like; and thereafter removing the mask. The first electrode 8 may be made of a metal material such as Ti, Pt, Au, W, Ni or the like, or alloy of the foregoing metals, or may be a multilayer film of the foregoing alloy or metal materials.

Forming First Protective Film

Preferably, a first protective film 9 is formed on the lower surface side of the semiconductor layered body 2. The first protective film 9 can be formed by layering an insulating material by sputtering or the like. The first protective film 9 is preferably made of a material similar to that of the second protective film 4. Preferably, the first protective film 9 is provided with an opening where the upper surface of the first electrode 8 is exposed outside the first protective film 9. The portion of the first electrode 8 exposed at the opening serves as an external connection-purpose region which is connected to an external element via a conductive member.

EXAMPLE

Figure 3A:
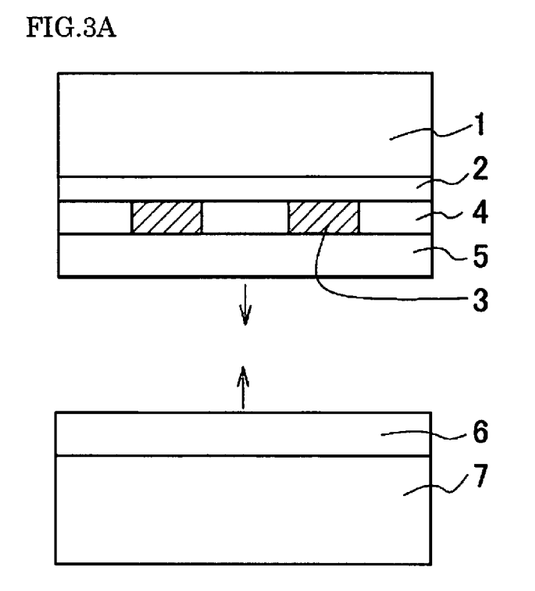
FIG. 3A shows a manufacturing operation in the method of manufacturing a light emitting element of the present disclosure.

Firstly, as shown in FIG. 3A, on the upper surface of the substrate 1 made of sapphire, an n-type semiconductor layer, a light emitting layer and a p-type semiconductor layer each made of a nitride semiconductor were formed in sequence by MOCVD, to form the semiconductor layered body 2. In the following, the element including the substrate 1 on which the semiconductor layered body 2 is formed may be referred to as the wafer.

At part of the upper surface of the p-type semiconductor layer, the second electrode 3 (hereinafter also referred to as the "p-electrode 3") was formed. The insulating protective film 4 was formed at a region in the upper surface of the p-type semiconductor layer where the p-electrode 3 was not formed.

Thereafter, the bonding layer 5 was formed on the upper surface side of the semiconductor layered body 2 where the p-electrode 3 was formed. The bonding layer 5 was, for example, a multilayer film including Ti/NiSn in sequence from the upper surface side of the semiconductor layered body 2.

Separately, as shown in FIG. 3A, the supporting substrate 7 made of Si and provided with the bonding layer 6 on its upper surface was provided. Similarly to the bonding layer formed on the upper surface side of the semiconductor layered body 2, the bonding layer 6 was a multilayer film including Ti/NiSn in sequence from the upper surface side of the supporting substrate 7.

By bring the bonding layer 6 on the supporting substrate 7 and the bonding layer 5 on the semiconductor layered body 2 into contact with each other and applying heat, the bonding layer 6 and the bonding layer 5 were bonded to each other.

Figure 3B:
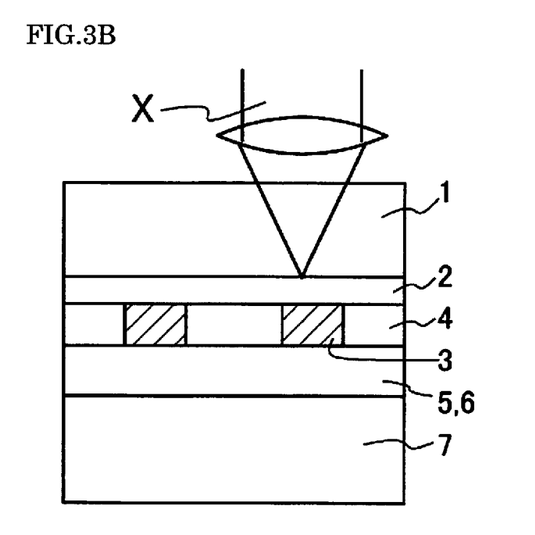
FIG. 3B shows a manufacturing operation in the method of manufacturing a light emitting element of the present disclosure.

Next, as shown in FIG. 3B, setting the focus position of laser light X at the interface between the substrate 1 and the semiconductor layered body 2, the wafer was irradiated from the substrate 1 side with the laser light X capable of transmitting through the substrate 1. Here, the focus position was set at the interface between the substrate 1 and the semiconductor layered body 2 about the center of the substrate 1. The laser light was Nd-doped YAG laser with an output of 1.2 W. Further, the interval of laser light scanning was 15 µm.

Figure 1:
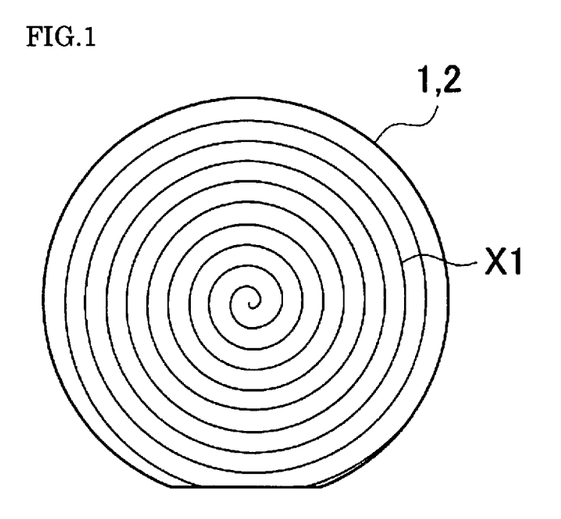
FIG. 1 is a plan view of a wafer being spirally or concentrically scanned with laser light in a method of manufacturing a light emitting element of the present disclosure.

Firstly, as shown in FIG. 1, the wafer was spirally scanned with laser light X1 from the center of the wafer along the circumferential edge of the wafer. Subsequently, as shown in FIG. 2, the wafer was scanned with laser light X2 so that the laser light intersects with the circumferential edge of the wafer at a plurality of portions, for example, at 1,200 to 1,500 portions. Further, the wafer was irradiated with the laser light scanning in a reciprocating manner in parallel to the orientation flat, so that the perimeter length within a region including the plurality of intersecting portions becomes about ⅙ as great as the entire perimeter length of the circumferential edge of the wafer. Thus, at the interface between the substrate 1 and the semiconductor layered body 2, part of the GaN semiconductor layer was decomposed into Ga and $N_2$.

Figure 3C:
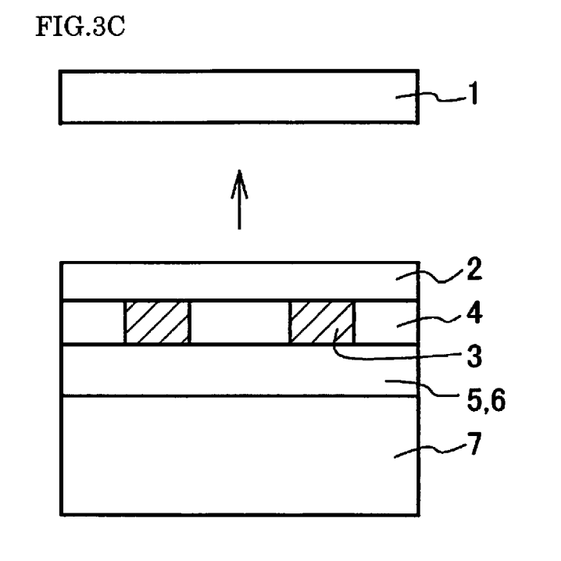
FIG. 3C shows a manufacturing operation in the method of manufacturing a light emitting element of the present disclosure.

Thereafter, by immersing the wafer in warm water, as shown in FIG. 3C, separation at the interface between the substrate 1 and the semiconductor layered body 2 was facilitated, and the substrate 1 was separated from the semiconductor layered body 2.

Thereafter, one surface of the semiconductor layered body 2 from which the substrate 1 was removed was polished by CMP.

Figure 3D:
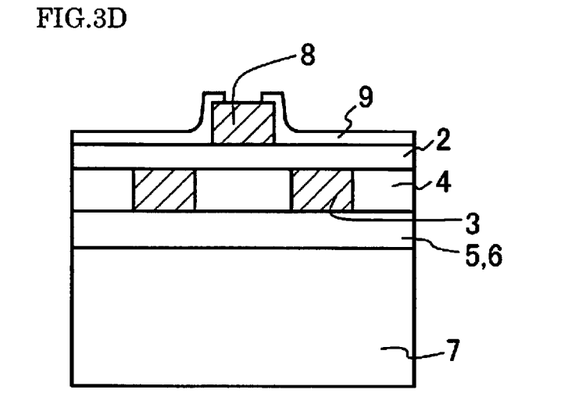
FIG. 3D shows a manufacturing operation in the method of manufacturing a light emitting element of the present disclosure.

Further, as shown in FIG. 3D, on the n-type semiconductor layer exposed on the side of the semiconductor layered body 2 where the substrate 1 had been removed, the first electrode 8 (hereinafter also referred to as the "n-electrode 8") was formed. Next, the insulating protective film 9 that covered the semiconductor layered body 2 and the n-electrode 8 and had an opening over part of the n-electrode 8 was formed.

According to such a method, the substrate 1 was removed simply, quickly, and highly precisely from the semiconductor layered body 2. The method according to Example took about 10 minutes to irradiate the wafer with the laser light, and about 40 minutes to immerse the wafer in warm water to separate the substrate 1 from the semiconductor layered body 2. That is, the time taken to irradiate the wafer with the laser light and the time taken to immerse the wafer in warm water were about 50 minutes in total.

Comparative Example 1

Similarly to Example, the bonded body in which the wafer and the supporting substrate 7 were bonded to each other was formed. A manufacturing method according to Comparative Example 1 is similar to Example except for the scanning condition of the laser light and, therefore, the detailed description thereof is not repeated. Note that, the type, output, and scanning interval of the laser light are identical to those in Example.

In the manufacturing method according to Comparative Example 1, as the scanning pattern A, the wafer was spirally scanned with laser light outward from the center of the wafer along the circumferential edge of the wafer. It took about 5 minutes to irradiate the wafer with the laser light. Thereafter, similarly to Example, the wafer was immersed in warm water. In Comparative Example 1, the scanning pattern B in which the wafer was scanned with the laser light so that the laser light intersected with the circumferential edge of the wafer at a plurality of portions was not performed. In the manufacturing method according to Comparative Example 1, the immersing the wafer in warm water after irradiating the wafer with the laser light did not separate the substrate 1 from the semiconductor layered body 2. Note that, while separation was visually recognized on the inner side of the wafer, the substrate and the semiconductor layered body did not separate from each other despite the wafer being immersed in warm water. This may be attributed to the circumferential edge of the wafer not having any part for allowing entry of warm water.

Comparative Example 2

Similarly to Example, the bonded body in which the wafer and the supporting substrate 7 were bonded to each other was formed. A manufacturing method according to Comparative Example 2 is similar to Example except for the scanning condition of the laser light and, therefore, the detailed description thereof is not repeated. Note that, the type, output, and scanning interval of the laser light are identical to those in Example.

Figure 4:
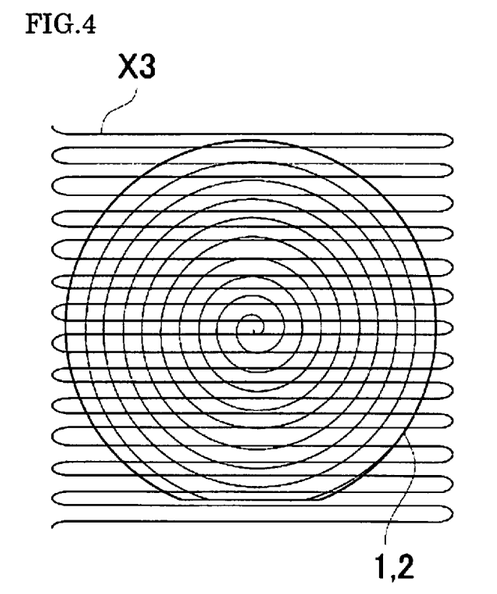
FIG. 4 is a plan view of a wafer being scanned with other laser light intersecting with the circumferential edge of the wafer at a plurality of portions in the method of manufacturing a light emitting element of the present disclosure.

In the manufacturing method according to Comparative Example 2, the scanning pattern B as shown in FIG. 4 in which the wafer was scanned with the laser light X3 so that the laser light intersected with the circumferential edge of the wafer at a plurality of portions was performed. Comparative Example 2 omitted the scanning pattern A. Comparative Example 2 took about 10 minutes to irradiate the wafer with the laser light. Thereafter, the wafer was immersed in warm water, and similarly to Example, the substrate 1 was separated from the semiconductor layered body 2. In the manufacturing method according to Comparative Example 2, it took about 45 minutes to immerse the wafer in warm water to separate the substrate 1 from the semiconductor layered body 2. That is, the time taken to irradiate the wafer with the laser light and the time taken to immerse the wafer in warm water were about 55 minutes in total.

As has been described above, Example achieved quicker separation of the substrate 1 from the semiconductor layered body 2 as compared to Comparative Examples 1, 2. Hence, it was verified that the manufacturing method according to Example is superior in mass productivity than the methods according to Comparative Examples 1, 2.

What is claimed is:

1. A method of manufacturing a light emitting element comprising:
   providing a wafer including a substrate having an orientation flat portion and a semiconductor layered body formed at an upper surface of the substrate;
   irradiating the wafer with laser light by
      performing a first pattern of scanning in which the wafer is irradiated with the laser light outwardly from an inner side of the wafer or inwardly from an outer side of the wafer, so that a region irradiated with the laser light enlarges, the first pattern of scanning being performed along a path that intersects the orientation flat portion, and
      after the performing of the first pattern of scanning, performing a second pattern of scanning in which the wafer is irradiated with the laser light so that the laser light intersects with a circumferential edge of the wafer at a plurality of portions other than the orientation flat portion and so that a perimeter length of the circumferential edge of the wafer within a region scanned by the laser light is equal to or less than ⅓ of an entire perimeter length of the circumferential edge of the wafer, a center portion of the wafer being not irradiated with the laser by the second pattern of scanning; and
   separating the substrate from the semiconductor layered body.

2. The method of manufacturing a light emitting element according to claim 1, further comprising
   before the irradiating of the wafer with laser light, bonding an upper surface of the wafer to a supporting substrate.

3. The method of manufacturing a light emitting element according to claim 2, wherein
   the irradiating of the wafer with the laser light includes irradiating the wafer with the laser light having a focus position of the laser light set at an interface between the substrate and the semiconductor layered body.

4. The method of manufacturing a light emitting element according to claim 2, wherein
   the performing of the first pattern of scanning includes spirally scanning the wafer with the laser light outwardly from the inner side of the wafer or inwardly from the outer side of the wafer.

5. The method of manufacturing a light emitting element according to claim 2, wherein
   the separating of the substrate from the semiconductor layered body includes immersing the wafer in water.

6. The method of manufacturing a light emitting element according to claim 2, wherein
   the substrate is made of sapphire.

7. The method of manufacturing a light emitting element according to claim 1, wherein
   the irradiating of the wafer with the laser light includes irradiating the wafer with the laser light having a focus position of the laser light set at an interface between the substrate and the semiconductor layered body.

8. The method of manufacturing a light emitting element according to claim 7, wherein
   the performing of the first pattern of scanning includes spirally scanning the wafer with the laser light outwardly from the inner side of the wafer or inwardly from the outer side of the wafer.

9. The method of manufacturing a light emitting element according to claim 7, wherein
   the separating of the substrate from the semiconductor layered body includes immersing the wafer in water.

10. The method of manufacturing a light emitting element according to claim 7, wherein
    the substrate is made of sapphire.

11. The method of manufacturing a light emitting element according to claim 1, wherein
    the performing of the first pattern of scanning includes spirally scanning the wafer with the laser light outwardly from the inner side of the wafer or inwardly from the outer side of the wafer.

12. The method of manufacturing a light emitting element according to claim 1, wherein
    the separating of the substrate from the semiconductor layered body includes immersing the wafer in water.

13. The method of manufacturing a light emitting element according to claim 1, wherein
    the substrate is made of sapphire.

14. The method of manufacturing a light emitting element according to claim 1, wherein the second pattern of scanning is performed along a direction parallel to the orientation flat portion.

15. The method of manufacturing a light emitting element according to claim 1, wherein
the performing of the first pattern of scanning includes continuously irradiating the laser light throughout the first pattern of scanning.

* * * * *